(12) United States Patent
Nakata et al.

(10) Patent No.: US 11,380,222 B2
(45) Date of Patent: Jul. 5, 2022

(54) DISPLAY DEVICE

(71) Applicant: SHARP KABUSHIKI KAISHA, Sakai (JP)

(72) Inventors: Yukinobu Nakata, Sakai (JP); Tetsunori Tanaka, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 133 days.

(21) Appl. No.: 16/981,495

(22) PCT Filed: Mar. 27, 2018

(86) PCT No.: PCT/JP2018/012528
§ 371 (c)(1),
(2) Date: Sep. 16, 2020

(87) PCT Pub. No.: WO2019/086712
PCT Pub. Date: Oct. 3, 2019

(65) Prior Publication Data
US 2021/0035477 A1 Feb. 4, 2021

(51) Int. Cl.
*H01L 27/32* (2006.01)
*H01L 51/00* (2006.01)
*G09F 9/30* (2006.01)
*G06F 1/18* (2006.01)
*H01L 51/52* (2006.01)

(52) U.S. Cl.
CPC ............. *G09F 9/301* (2013.01); *G06F 1/189* (2013.01); *H01L 27/3276* (2013.01); *H01L 51/0097* (2013.01); *H01L 51/5253* (2013.01)

(58) Field of Classification Search
CPC ........ G09F 9/301; G06F 1/189; G06F 1/1652; H01L 27/3276; H01L 51/0097; H01L 51/5253; Y02E 10/549; H05B 33/06
See application file for complete search history.

(56) References Cited

U.S. PATENT DOCUMENTS

| | | |
|---|---|---|
| 2014/0353670 A1 | 12/2014 | Youn et al. |
| 2015/0287750 A1 | 10/2015 | Youn et al. |
| 2020/0243782 A1* | 7/2020 | Maruyama .......... H01L 27/3272 |

FOREIGN PATENT DOCUMENTS

JP   2014-232300 A   12/2014

* cited by examiner

*Primary Examiner* — Kyoung Lee
(74) *Attorney, Agent, or Firm* — ScienBiziP, P.C.

(57) ABSTRACT

In a bending region in a frame region, a slit is formed in at least one inorganic film included in a TFT layer extending through the inorganic film and exposing an upper surface of a second resin film of a resin substrate layer, and at least one opening is formed in an inorganic insulating film of the resin substrate layer in the bending region. In the opening, a first resin film and the second resin film are in contact with one another.

18 Claims, 16 Drawing Sheets

DISPLAY DEVICE

TECHNICAL FIELD

The disclosure relates to a display device.

BACKGROUND ART

In recent years, self-luminous organic EL display devices, which use organic electroluminescent (EL) elements have attracted attention as a display device that can replace a liquid crystal display device. As the organic EL display device, a flexible organic EL display device, in which an organic element and a variety of films are layered on a flexible resin substrate, has been proposed. The organic EL display device is provided with a rectangular display region for displaying an image and a frame region formed around the display region, where reduction of the frame region is demanded. In a flexible organic EL display device, for example, if the frame region located on a terminal side is reduced by bending the frame region, wiring lines arranged in the frame region may break.

For example, PTL 1 discloses a flexible display device in which a bending hole is formed to remove a portions of a buffer film, a gate insulating film, and an interlayer insulating film each corresponding to the bending region, and thus prevent breakage of wiring lines.

CITATION LIST

Patent Literature

PTL 1: JP 2014-232300 A

SUMMARY

Technical Problem

However, in a flexible organic EL display device, a resin substrate with a layered structure in which an inorganic insulating film is interposed between two resin films is used to impart a moisture-proof function to the display region.

However, since adhesion between the resin film and the inorganic insulating film is generally low, in the bending region in the frame region, the resin film and the inorganic insulating film may peel at the interface between the resin film and the inorganic insulating film, or the inorganic insulating film may be damaged due to the resin substrate bending. As a result, the wiring line provided on the resin substrate is stressed and may break.

The disclosure has been made in view of the above, and an object of the disclosure is to enhance the structure of a resin substrate in a bending region in a frame region and prevent wiring line breakage.

Solution to Problem

To achieve the object described above, a display device according to the disclosure includes: a resin substrate including a first resin film, an inorganic insulating film, and a second resin film layered in this order, a light-emitting element included in a display region, the light-emitting element being provided over the resin substrate with a TFT layer in between, a frame region provided around the display region, a terminal portion provided at an end portion of the frame region, a bending region provided between the display region and the terminal portion, at least one inorganic film provided in the frame region and included in the TFT layer layered on a surface of the resin substrate, a frame flattening film provided covering the inorganic film on the surface of the resin substrate, and frame wiring lines connected to the light-emitting element and extending to the terminal portion, the frame wiring lines being provided on a surface of the inorganic film and a surface of the frame flattening film, in which, in the bending portion, a slit is formed in the inorganic film extending through the inorganic film and exposing an upper surface of the second resin film of the resin substrate, at least one opening is formed in the inorganic insulating film of the resin substrate in the bending region, and the first resin film and the second resin film are in contact with one another in the opening.

Advantageous Effects of Disclosure

According to the disclosure, because the first resin film and the second resin film are in contact with each other in the bending region in the frame region, peeling at the interface between the first and second resin films and damage to the inorganic insulating film can be minimized or prevented and breakage of the frame wiring lines can be prevented.

DESCRIPTION OF EMBODIMENTS

Embodiments of the disclosure will be described below in detail with reference to the drawings. The disclosure is not limited to the embodiments described below.

First Embodiment

Figure 1:
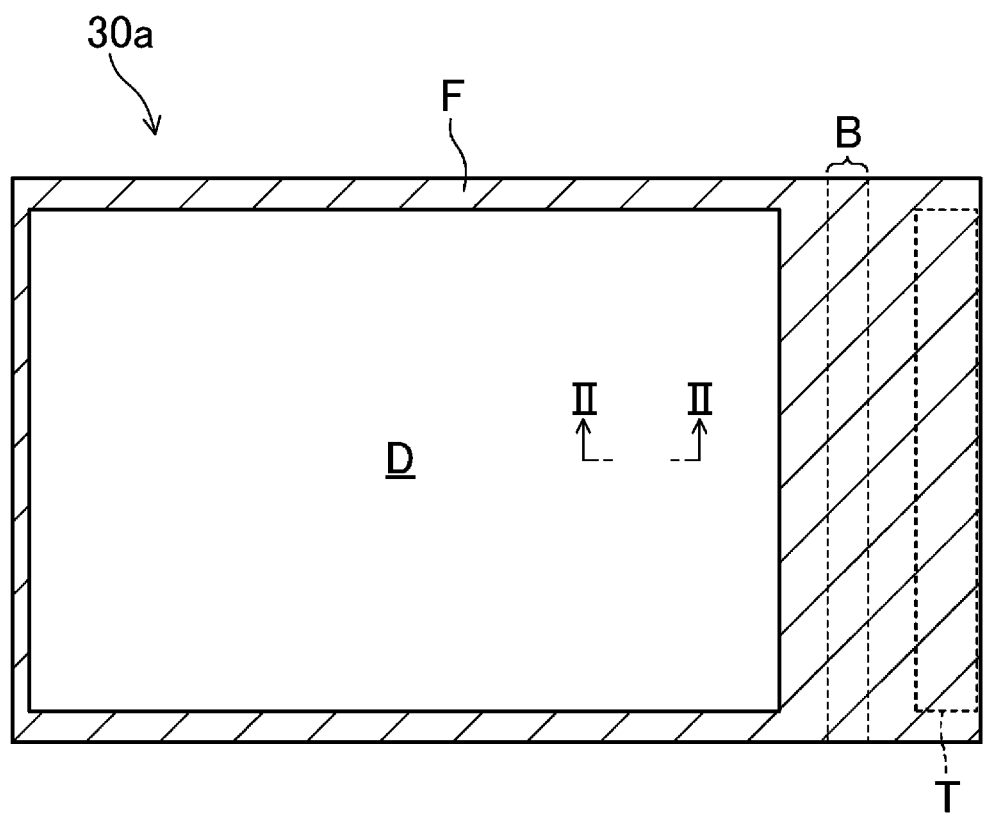
FIG. 1 is a plan view of an organic EL display device according to a first embodiment of the disclosure.
Figure 2:
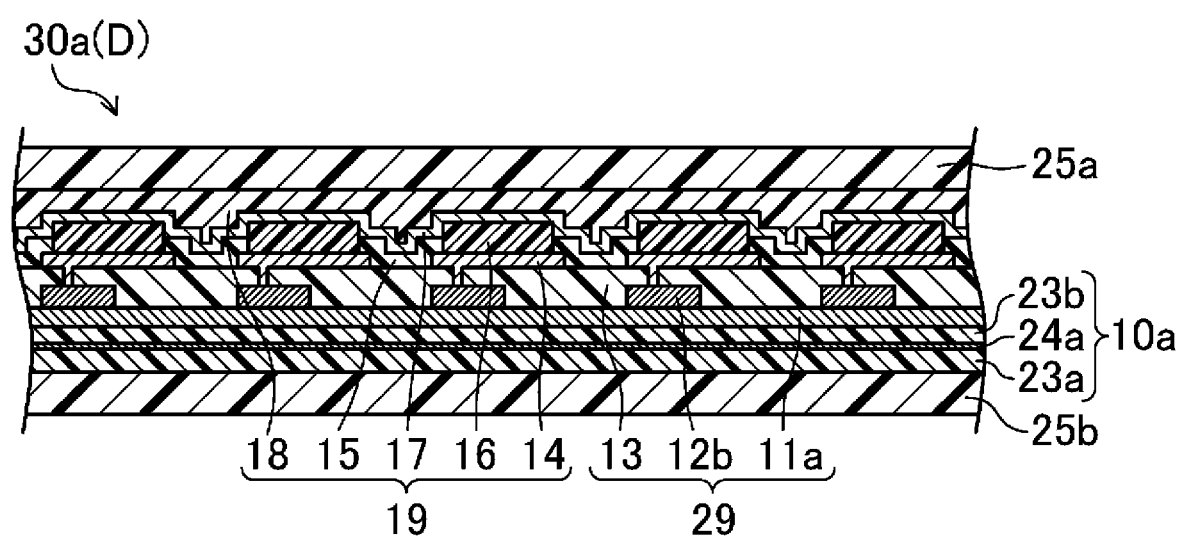
FIG. 2 is a cross-sectional view of the organic EL display device taken along the line IIII in FIG. 1.
Figure 3:
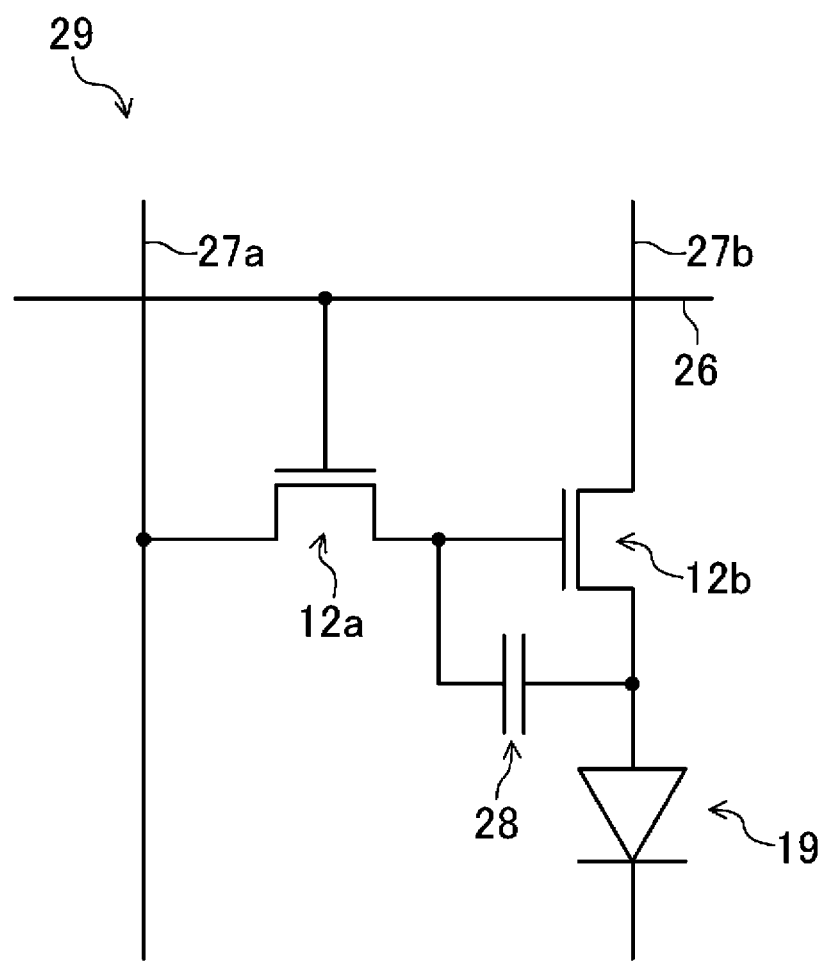
FIG. 3 is an equivalent circuit diagram of a TFT layer included in the organic EL display device according to the first embodiment of the disclosure.
Figure 4:
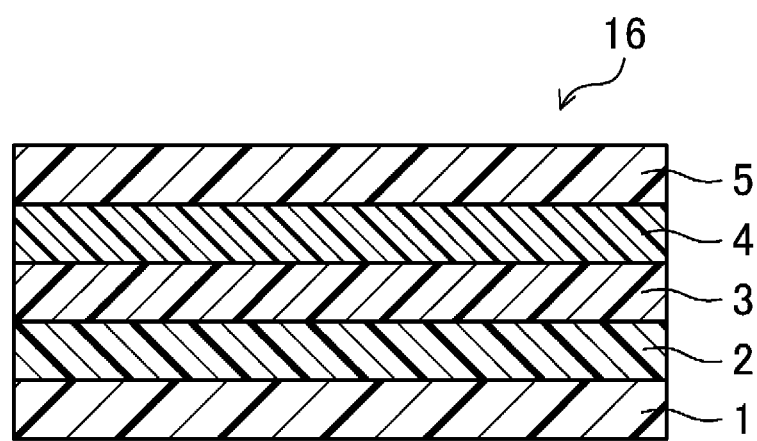
FIG. 4 is a cross-sectional view illustrating an organic EL layer included in the organic EL display device according to the first embodiment of the disclosure.
Figure 5:
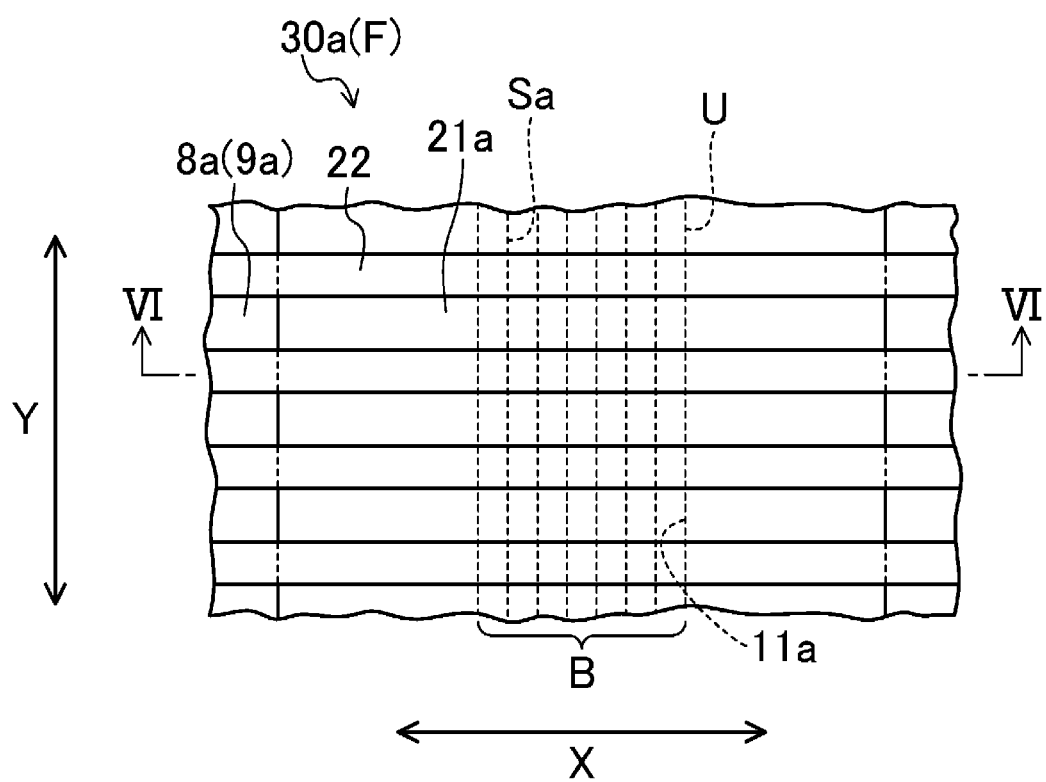
FIG. 5 is a plan view illustrating a bending region in a frame region of the organic EL display device according to the first embodiment of the disclosure.
Figure 6:
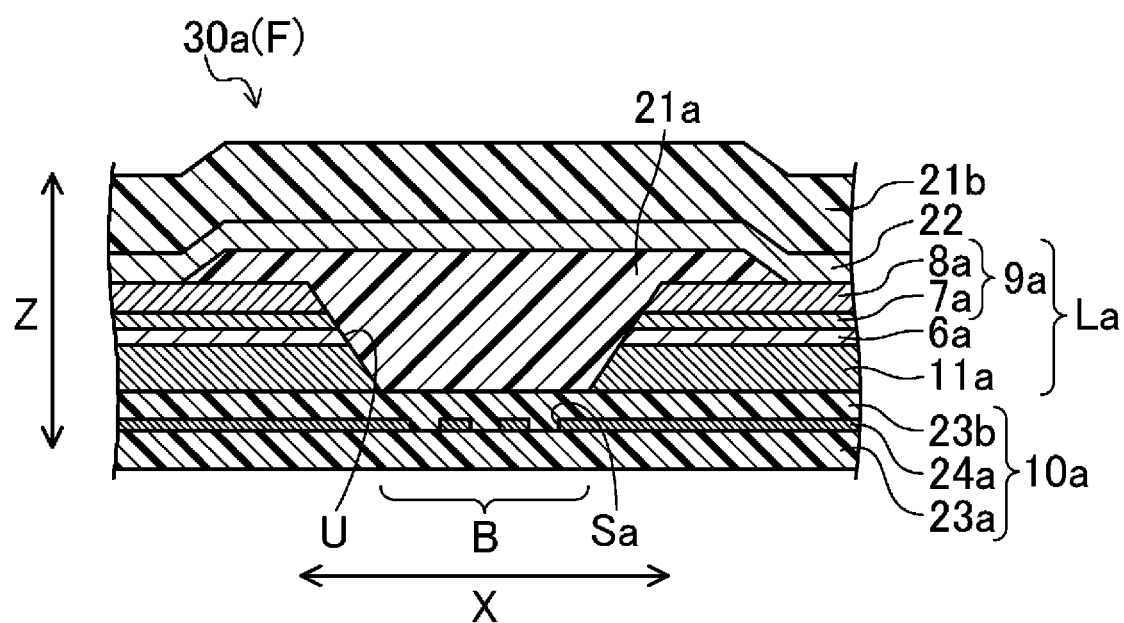
FIG. 6 is a cross-sectional view, taken along the line VI-VI of FIG. 5, illustrating the bending region of the organic EL display device according to the first embodiment of the disclosure.
Figure 7:
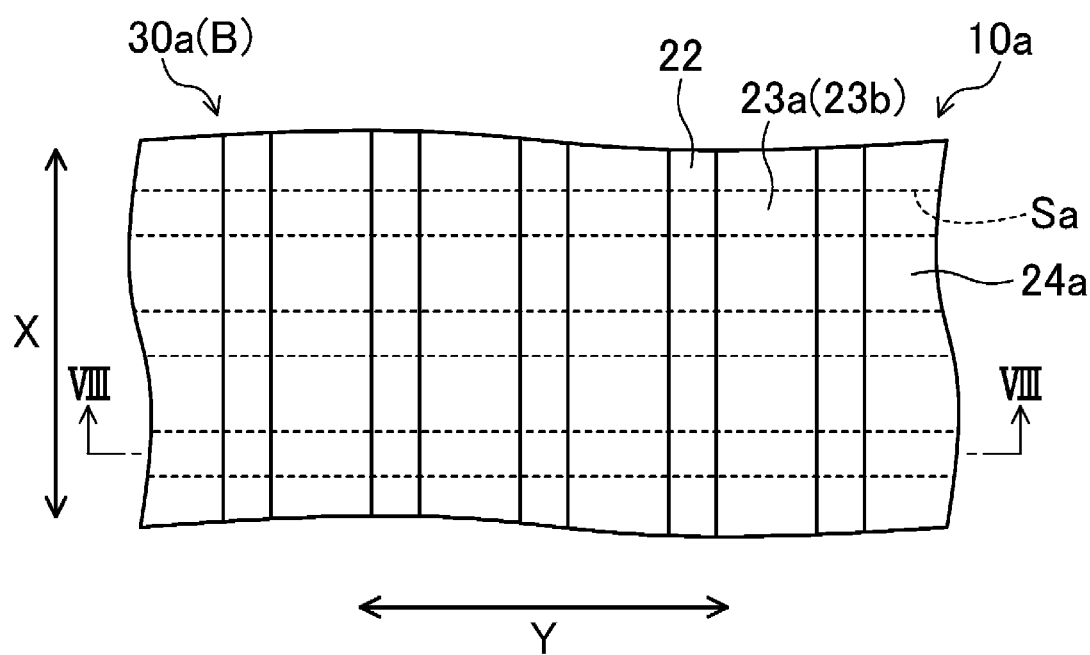
FIG. 7 is an enlarged plan view of a B portion of FIG. 5 illustrating only the bending region of the organic EL display device according to the first embodiment of the disclosure.
Figure 8:
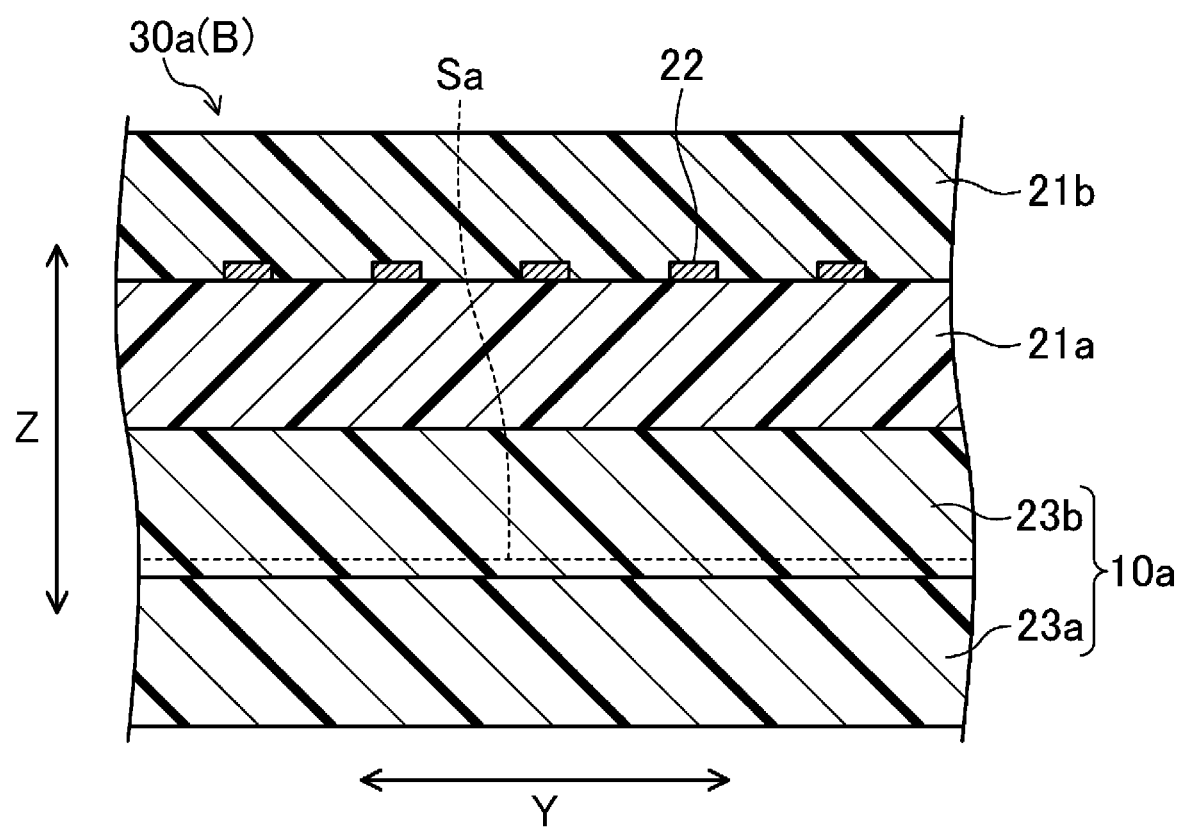
FIG. 8 is an enlarged cross-sectional view, taken along the line VIII-VIII of FIG. 7, illustrating only the bending region of the organic EL display device according to the first embodiment of the disclosure.

FIG. 1 to FIG. 8 illustrate a first embodiment of a display device according to the disclosure. Note that, in each of the following embodiments, an organic EL display device including an organic EL element will be described as a display device including a light-emitting element. FIG. 1 is a plan view of an organic EL display device 30a according to the present embodiment. FIG. 2 is a cross-sectional view of the organic EL display device 30a taken along the line II-II in FIG. 1. FIG. 3 is an equivalent circuit diagram of a TFT layer 29 included in the organic EL display device 30a. FIG. 4 is a cross-sectional view of an organic EL layer 16 included in the organic EL display device 30a. FIG. 5 is a plan view illustrating a bending region B in a frame region F of the organic EL display device 30a. FIG. 6 is a cross-sectional view, taken along the line VI-VI of FIG. 5, illustrating the bending region B of the organic EL display device 30a. FIG. 7 is an enlarged plan view of a B portion of FIG. 5 illustrating only the bending region B of the organic EL display device 30a. FIG. 8 is an enlarged cross-sectional view, taken along the line VIII-VIII of FIG. 7, illustrating only the bending region B of the organic EL display device 30a.

As illustrated in FIG. 1, the organic EL display device 30a includes a display region D defined in a rectangular shape for displaying an image, and the frame region F (hatched portion in the drawing) defined in the periphery of the display region D. Here, as illustrated in FIG. 2, the display region D of the organic EL display device 30a is provided with organic EL elements 19 and a plurality of pixels arranged in a matrix pattern, Note that each of the pixels in the display region D includes, for example, a subpixel for displaying red gray scale, a subpixel for displaying green gray scale, and a subpixel for displaying blue gray scale. These subpixels are arrayed adjacent to one another. As illustrated in FIG. 1, a terminal portion T is provided at the right end portion of the frame region F in the figure. Further, as illustrated in FIG. 1, between the display region and the terminal portion T in the frame region F, the bending region B bendable at 180 degrees (in a U-shape) about a bending axis being the vertical direction in the drawing is provided along one side (the right side in the drawing) of the display region D. Note that in the present specification, the bending region B refers the entire U-shaped region including the portion bendable in a U-shape and the portion extending toward the display region D from the bending portion.

As illustrated in FIG. 2, the organic EL display device 30a includes, in the display region D, a resin substrate layer 10a, the TFT layer 29 provided on the front surface of the resin substrate layer 10a, the organic EL element 19 provided, as a light-emitting element, on the front surface of the ITT layer 29, a front surface side protection layer 25a provided on the front surface of the organic EL element 19, and a back surface side protection layer 25b provided on the back surface of the resin substrate layer 10a.

As illustrated in FIG. 2, the resin substrate layer 10a has a multilayer configuration including a first resin film 23a, an inorganic insulating film 24a, and a second resin film 23b layered in this order. The first resin film 23a and the second resin film 23b are formed from an organic resin material such as polyimide resin, acrylic resin, polysiloxane resin, novolac resin, or the like. The first resin film 23a and the second resin film 23b may be the same organic resin material or may be different organic resin materials, Note that the same organic resin material is preferable from the perspective of improving adhesion between the first resin film 23a and the second resin film 23b. The thickness of the first resin film 23a is approximately from 5 μm to 20 μm. The thickness of the second resin film 23b is approximately from 5 μm to 20 μm.

The inorganic insulating film 24a is formed from a silicon nitride (SiNx (x is a positive number)), such as silicon oxide ($SiO_2$) or trisilicon tetranitride ($Si_3N_4$), a silicon oxynitride, such as silicon oxynitride (SiNO), or the like. The thickness of the inorganic insulating film 24a is approximately from 0.4 μm to 0.8 μm. Note that the thickness of the resin substrate layer 10a is approximately from 10 μm to 40 μm.

As illustrated in FIG. 2, the TFT layer 29 includes a base coat film 11a provided on the resin substrate layer 10a, a plurality of first TFTs 12a (see FIG. 3) and a plurality of second TFTs 12b that are provided on the base coat film 11a, and a Tyr flattening film 13 provided on the first TFTs 12a and the second TFTs 12h. As illustrated in FIG. 3, the TFT layer 29 is provided with a plurality of gate lines 26 provided to extend in parallel to one another in the horizontal direction in the figure. As illustrated in FIG. 3, the TFT layer 29 is also provided with a plurality of source lines 27a provided to extend in parallel to one another in the vertical direction in the figure. As illustrated in FIG. 3, the TFT layer 29 is further provided with a plurality of power source lines 27b each provided adjacent to each source line 27a to extend in parallel to one another in the vertical direction in the figure. As illustrated in FIG. 3, the TFT layer 29 is further provided with, in each subpixel, the first TFT 12a, the second TFT 12b, and a capacitor 28.

The base coat film 11 a is made up of a single-layer film or a layered film of an inorganic film of, for example, silicon nitride, silicon oxide, silicon oxide nitride, or the like.

As illustrated in FIG. 3, the first TFT 12a is coupled to a corresponding gate line 26 and source line 27a in each subpixel. As illustrated in FIG. 3, the second TFT 12b is coupled to a corresponding first TFT 12a and power supply line 27b in each subpixel. The first TFT 12a and the second TFT 12b each include, for example, a semiconductor layer provided in an island shape on the base coat film 11a, a gate insulating film 6a (see FIG. 6) provided to cover the semiconductor layer, a gate electrode provided to partially overlap with the semiconductor layer on the gate insulating film 6a, an interlayer insulating film 9a (see FIG. 6) provided to cover the gate electrode, and a source electrode and a drain electrode provided in a manner spaced apart from each other on the interlayer insulating film 9a. Note that, although a top-gate type is described in the first embodiment as an example of the first TFT 12a and the second TFT 12b, the first TFT 12a and the second TFT 12b may be of the bottom-gate type.

As illustrated in FIG. 3, the capacitor 28 is coupled to the corresponding first TFT 12a and power supply line 27b in each subpixel. The capacitor 28 is formed with, for example, one electrode formed of the same material in the same layer as the gate electrode, the other electrode formed of the same material in the same layer as the source electrode and the drain electrode, and the interlayer insulating film 9a (see FIG. 6) provided between the pair of these electrodes.

The TFT flattening film 13 is formed of, for example, a colorless and transparent organic resin material, such as a polyimide resin.

As illustrated in FIG. 2, the organic EL element 19 includes a plurality of first electrodes 14, an edge cover 15, a plurality of organic EL layers 16, a second electrode 17, and a sealing film 18, which are provided in the order stated, over the TFT flattening film 13.

As illustrated in FIG. 2, the plurality of first electrodes 14 are provided, each corresponding to each subpixel, in a matrix pattern over the TFT flattening film 13. As illustrated in FIG. 2, one first electrode 14 is connected to the drain electrode of each TFT 12 via a contact hole formed through the TFT flattening film 13. The first electrode 14 functions to inject holes into the organic EL layer 16. It is further preferable that the first electrodes 14 include a material having a large work function to improve the efficiency of hole injection into the organic EL layer 16. Examples of materials that constitute the first electrode 14 include metal materials, such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (in), magnesium (Mg), lithium (Li), ytterbium (Yb), and lithium fluoride (LiF). Further examples of materials that constitute the first electrode 14 include alloys such as magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), and lithium fluoride (LiF)-calcium (Ca)-aluminum (Al). Examples of materials that constitute the first electrode 14 include electrically-conductive oxides, examples of which include tin oxide (SnO), zinc oxide (ZnO), indium tin oxide (ITO), and indium zinc oxide (IZO). The first electrode 14 may include a stack of a plurality of layers of any of the above-mentioned materials. Note that, examples of materials having a large work function include indium tin oxide (ITO) and indium zinc oxide (IZO).

As illustrated in FIG. 2, the edge cover 15 is provided in a lattice pattern and surrounds the outer perimeter portion of each first electrode 14. Here, examples of materials that constitute the edge cover 15 include an inorganic film, for example, a silicon oxide ($SiO_2$) film, a silicon nitride (SiNx (x is a positive number)) film such as a trisilicon tetranitride ($Si_3N_4$) film, or a silicon oxynitride (SiNO) film; and an organic film, for example, a polyimide resin film, an acrylic resin film, a polysiloxane resin film, or a novolak resin film.

As illustrated in FIG. 2, the plurality of organic EL layers 16 are provided in a matrix pattern, each being arranged on each first electrode 14 and each corresponding to each subpixel. Here, as illustrated in FIG. 4, the organic EL layers 16 each include a hole injection layer 1, a hole transport layer 2, a light-emitting layer 3, an electron transport layer 4, and an electron injection layer 5, which are provided in the order stated, over the first electrode 14.

The hole injection layer 1 is also referred to as an anode buffer layer, and functions to reduce the energy level difference between the first electrode 14 and the organic EL layer 16, to improve the efficiency of hole injection into the organic EL layer 16 from the first electrode 14. Examples of materials that constitute the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 14 to the organic EL layer 16. Here, examples of materials that constitute the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where holes and electrons recombine, when a voltage is applied via the first electrode 14 and the second electrode 17, the holes and electrons are injected from the first electrode 14 and the second electrode 17, respectively. The light-emitting layer 3 is formed of a material having high light-emitting efficiency. Examples of materials that constitute the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate migration of electrons to the light-emitting layer 3 efficiently. Examples of materials constituting the electron transport layer 4 include oxadiazole derivative, triazole derivative, benzoquinone derivative, naphthoquinone derivative, anthraquinone derivative, tetracyanoanthraquinodimethane derivative, diphenoquinone derivative, fluorenone derivative, silole derivative, and metal oxinoid compound, as organic compounds.

The electron injection layer 5 functions to reduce the energy level difference between the second electrode 17 and the organic EL layer 16 to improve the efficiency of electron injection into the organic EL layer 16 from the second electrode 17. Because of this function, the drive voltage for the organic EL element 19 can be reduced. Note that the electron injection layer 5 is also referred to as a cathode buffer layer. Here, examples of materials that may constitute the electron injection layer 5 include inorganic alkaline compounds, such as lithium fluoride (Lin, magnesium fluoride ($MgF_2$), calcium fluoride ($CaF_2$), strontium fluoride (SrF$_2$), and barium fluoride (BaF$_2$), aluminum oxide (Al$_2$O$_3$), and strontium oxide (SrO).

As illustrated in FIG. 2, the second electrode 17 is disposed to cover the organic EL layers 16 and the edge cover 15. The second electrode 17 functions to inject electrons into the organic EL layer 16. It is further preferable that the second electrode 17 includes a material having a small work function to improve the efficiency of electron injection into the organic EL layer 16. Examples of materials that may constitute the second electrode 17 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 17 may be formed of an alloy such as magnesium (Mg)-copper (Cu), magnesium (Mg)-silver (Ag), sodium (Na)-potassium (K), astatine (At)-astatine oxide (AtO$_2$), lithium (Li)-aluminum (Al), lithium (Li)-calcium (Ca)-aluminum (Al), and lithium fluoride (LiF)-calcium (Ca)-aluminum (Al). Examples of materials that may constitute the second electrode 17 include electrically conductive oxides, examples of which include tin oxide (SnO), zinc oxide (ZnO), indium tin oxide (ITO), and indium zinc oxide (IZO). The second electrode 17 may include a stack of a plurality of layers of any of the above-mentioned materials. Note that, examples of materials having a small work function include magnesium (Mg), lithium (Li), lithium fluoride (Lin, magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

As illustrated in FIG. 2, the sealing film 18 is provided to cover the second electrode 17, and functions to protect the organic EL layer 16 from moisture and oxygen. Here, examples of materials that may constitute the sealing film 18 include inorganic materials, example of which include silicon oxide (SiO$_2$), aluminum oxide (Al$_2$O$_3$), silicon nitride (SiNx (x is a positive number)) such as trisilicon tetranitride Si$_3$N$_4$), and silicon carbon nitride (SiCN); and organic materials, example of which include acrylate, polyurea, parylene, polyimide, and polyamide.

The front surface side protection layer 25a and the back surface side protection layer 25b are each formed with, for example, a polyimide resin film or the like with a thickness of approximately 2 μm.

As illustrated in FIG. 5 and FIG. 6, the organic EL display device 30a includes, in the frame region F, the resin substrate layer 10a, an inorganic layered film La and a first flattening film (frame flattening film) 21a that are provided on the surface of the resin substrate layer 10a, a frame wiring line 22 provided on the front surfaces of the inorganic layered film La and the first flattening film 21a, and a second flattening film 21b provided to cover the frame wiring line 22. Note that, in the plan view of FIG. 5, the second flattening film 21b on the frame wiring line 22 is omitted.

The frame wiring line 22 is coupled to a signal wiring line (for example, a gate line, a source line, or a power source line) of the organic EL element 19 in the display region D and extends to the terminal portion T. The frame wiring line 22 is formed with, for example, a metal layered film of a titanium film (with a thickness of approximately 200 nm)/an aluminum film (with a thickness of approximately 100 nm)/a titanium film. (with a thickness of approximately 200 nm). Note that, although a frame wiring line 22 formed with a metal layered film is given as an example in the present embodiment, the frame wiring line 22 may also be formed with a metal single layer film.

The inorganic layered film La, which is formed with at least one inorganic film included in the TFT layer 29, includes, as illustrated in FIG. 6, the base coat film 11a, the gate insulating film 6a, and the interlayer insulating film 9a formed with a first interlayer insulating film 7a and a second interlayer insulating film 8a, which are layered in the order stated, over the resin substrate layer 10a.

As illustrated in FIG. 6, the base coat film 11a, the gate insulating film 6a, and the interlayer insulating film 9a of the inorganic layered film La are not provided at the bending region B in the frame region F. In other words, as illustrated in FIG. 6, in the bending region B, a slit U is formed in the inorganic layered film La extending through the inorganic layered film La and exposing the upper surface of the second resin film 23b of the resin substrate layer 10a. As illustrated in FIG. 6, the slit II is formed extending through the inorganic layered film La in a thickness direction Z thereof.

As illustrated in FIG. 6, the first flattening film 21a is provided covering the inorganic layered film La and filling the slit U. Furthermore, in this configuration, in the slit U, the second resin film 23b is exposed and the first flattening film 21a is provided such that the first flattening film 21a and the second resin film 23b are in direct contact. In other words, the slit U is a through-hole where the second resin film 23b and the first flattening film 21a come into direct contact with one another. In this configuration, in the bending region B, by providing the slit U in the inorganic layered film La that may be damaged as the foundation film of the frame wiring line 22, damage to the inorganic layered film La caused by the bending of the resin substrate layer 10a is prevented.

The first flattening film 21a and the second flattening film 21b are formed with, for example, an organic insulating film such as a polyimide resin film with a thickness of approximately 2 μm.

Note that the front surface side protection layer 25a and the back surface side protection layer 25b that are arranged in the display region D are also provided in the majority of the frame region F, but are not provided at the bending region B.

Here, in the present embodiment, the inorganic insulating film 24a in the bending region B includes at least one (three in FIG. 7) opening Sa as illustrated in FIG. 6 to FIG. 8. In the opening Sa, the first resin film 23a and the second resin film 23b are in direct contact with one another. Note that in the enlarged plan view of FIG. 7, the first flattening film 21a and the second flattening film 21b on the resin substrate layer 10a are omitted.

As illustrated in FIG. 6 and FIG. 8, the opening Sa is formed extending through the inorganic insulating film 24a in the thickness direction Z thereof. Also, in the opening Sa, the first resin film 23a is exposed and the second resin film 23b is provided in the opening Sa. With this configuration, the first resin film 23a is brought into direct contact with the second resin film 23b. In other words, the opening Sa is a through-hole where the exposed first resin film 23a and the second resin film 23b provided in the opening Sa come into direct contact with one another.

By bringing the first resin film 23a into direct contact via the opening Sa with the second resin film 23b, which has better adhesion with the first resin film 23a than the inorganic insulating film 24a, adhesion between the first resin film 23a and the second resin film 23b is improved. Thus, peeling between the first and second resin films 23a, 23b caused by bending of the resin substrate layer 10a in the bending region B can be minimized or prevented.

Furthermore, as illustrated in FIG. 7, the opening Sa is formed along an axial direction Y of the bend of the resin substrate layer 10a extending to both ends in the axial direction Y and is formed in a stripe pattern. Thus, stress applied to the inorganic insulating film 24a when the resin substrate layer 10a bends can be reduced. As a result, damage to the inorganic insulating film 24a caused by bending of the resin substrate layer 10a in the bending region B can be minimized or prevented.

The organic EL display device 30a described above has flexibility, and is configured, in each subpixel, such that the light-emitting layer 3 of the organic EL layer 16 is caused to appropriately emit light via the first TFT 12a and the second TFT 12b so that images are displayed.

The organic EL display device 30a of the present embodiment can be manufactured as described below.

For example, the organic EL display device 30a can be manufactured in such a way that the base coat film 11a and the organic EL element 19 are formed, by using a well-known method, on the front surface of the resin substrate layer 10a formed on a glass substrate, the front surface side protection layer 25a is applied to the organic EL element 19 via an adhesive layer, and then the back surface side protection layer 25b is applied to the back surface of the resin substrate layer 10a, from which the glass substrate has been peeled off, via an adhesive layer. The frame wiring line 22 of the frame region F is formed when the source electrode and the drain electrode of the TFT 12 that are included in the organic EL element 19 are formed. The first flattening film 21a in the frame region F is formed, before the formation of the source electrode and the drain electrode of the TFT 12 that are included in the organic EL element 19, by forming and patterning a photosensitive organic insulating film such as a polyimide resin film in the frame region F alone.

Furthermore, the opening Sa of the inorganic insulating film 24a in the bending region B is formed by, for example, forming the first resin film 23a on a glass substrate using a known method, and after forming the inorganic insulating film 24a on the first resin film 23a, forming a positive photosensitive organic insulating film formed from polyimide resin only in the bending region B and patterning the film into a predetermined shape.

The organic EL display device 30a of the present embodiment described above can achieve the following effects (1) to (3).

(1) At least one opening Sa is formed in the inorganic insulating film 24a in the bending region B, and, in the opening Sa, the first resin film 23a and the second resin film 23b are in direct contact with one another. Because the first resin film 23a is brought into direct contact via the opening Sa with the second resin film 23b, which has better adhesion with the first resin film 23a than the inorganic insulating film 24a, adhesion between the first resin film 23a and the second resin film 23b is improved. As a result, peeling between the first and second resin films 23a, 23b caused by the bending of the resin substrate layer 10a in the bending region B can be minimized.

(2) The opening Sa is formed along the axial direction Y of the bend of the resin substrate layer 10a extending to both ends in the axial direction Y. Thus, stress applied to the inorganic insulating film 24a when the resin substrate layer 10a bends can be reduced. As a result, damage to the inorganic insulating film 24a caused by bending of the resin substrate layer 10a in the bending region B can be minimized.

(3) According to (1) and (2) above, peeling between the first and second resin films 23a, 23b caused by bending of the resin substrate layer 10a in the bending region B, and damage to the inorganic insulating film 24a can be minimized or prevented. Thus, breakage of the frame wiring line 22 can be minimized.

Second Embodiment

Figure 9:
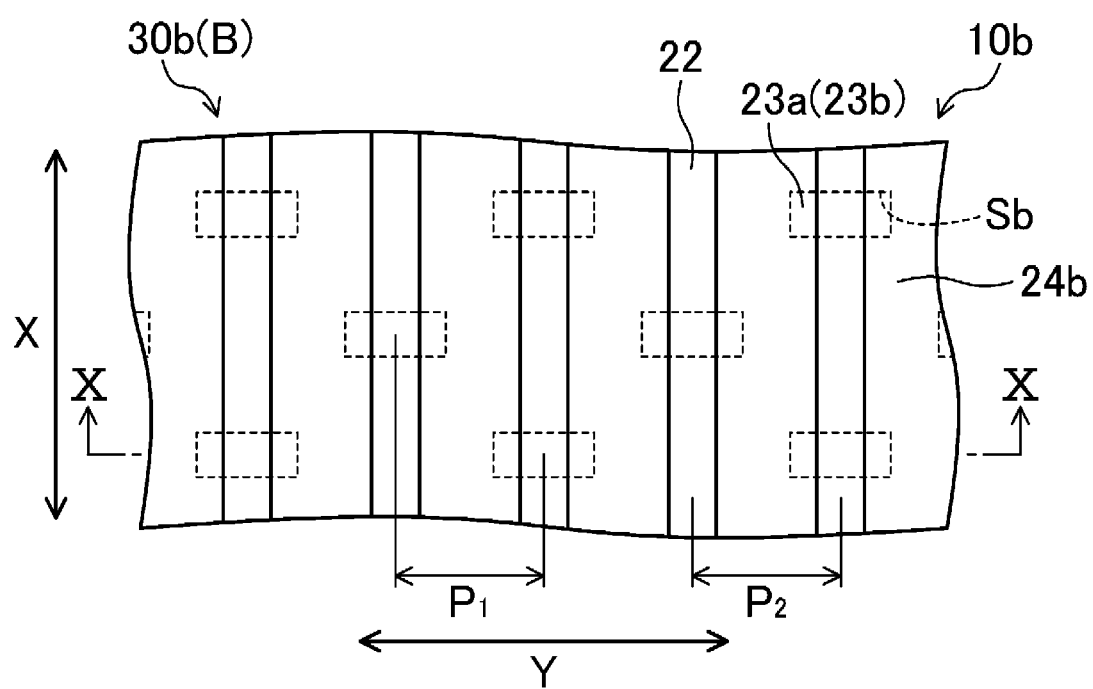
FIG. 9 is an enlarged plan view corresponding to FIG. 7 illustrating only the bending region of an organic EL display device according to a second embodiment of the disclosure.
Figure 10:
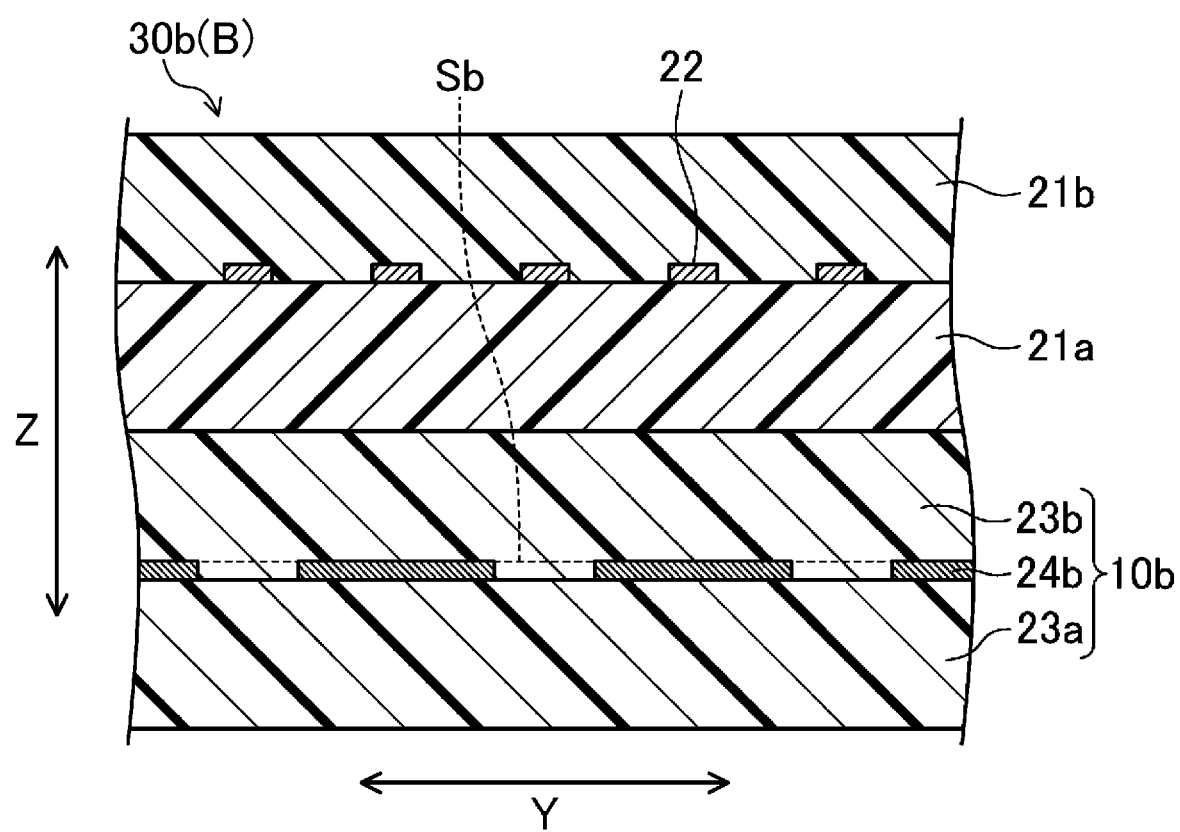
FIG. 10 is an enlarged cross-sectional view, taken along the line X-X of FIG. 9, illustrating only the bending region of the organic EL display device according to the second embodiment of the disclosure.

A second embodiment of the disclosure will be described below. FIG. 9 is an enlarged plan view corresponding to FIG. 7 illustrating only the bending region B of an organic EL display device 30b according to the present embodiment. FIG. 10 is an enlarged cross-sectional view, taken along the line X-X of FIG. 9, illustrating only the bending region B of the organic EL display device 30b. Note that, except for the bending region B, the entire configuration of the organic EL display device 30b including the display region D and the frame region F is the same as that of the first embodiment described above, and detailed description thereof will be omitted. Note that elements common to those in the first embodiment are denoted by the same reference signs, and duplicated description thereof will be omitted.

In the organic EL display device 30b of the present embodiment, as illustrated in FIG. 9 and FIG. 10, the inorganic insulating film 24b in the bending region B includes a plurality of openings Sb (10 in FIG. 9) disposed in a staggered manner in a plan view, Note that, in the enlarged plan view of FIG. 9, the first flattening film 21a and the second flattening film 21b on a resin substrate layer 10b are omitted.

As illustrated in FIG. 9, the openings Sb are formed along the axial direction Y of the bend of the resin substrate layer 10b in a similar manner to the first embodiment described above.

Also, as illustrated in FIG. 9, the openings Sb are configured such that a pitch $P^1$ of adjacent openings Sb is substantially the same as a pitch $P_2$ of adjacent frame wiring lines 22 in a direction substantially orthogonal to the extension direction of the frame wiring lines 22, that is, in the present embodiment, in the axial direction Y of the bend of the resin substrate layer 10b. As illustrated in FIG. 9 and FIG. 10, the openings Sb overlap the frame wiring lines 22 in a plan view.

Note that the organic EL display device 30b of the present embodiment can be manufactured by modifying the pattern shape of the inorganic insulating film 24a in the method for manufacturing the organic EL display device 30a of the first embodiment described above.

The organic EL display device 30b of the present embodiment described above is able to exhibit the following effects (4) to (6) in addition to the effects (1) to (3) described above.

(4) Because the first resin film 23a is brought into direct contact with the second resin film 23b via the plurality of openings Sb formed in a staggered manner in a plan view, adhesion between the first resin film 23a and the second resin film 23b is further improved.

(5) Because the plurality of openings Sb are provided, stress applied to the inorganic insulating film 24b when the resin substrate layer 10b bends is dispersed, and the stress is further reduced.

(6) The openings Sb are formed such that the pitch $P_1$ of adjacent openings Sb is substantially the same as the pitch $P_2$ of adjacent frame wiring lines 22 in the direction substantially orthogonal to the extension direction of the frame wiring lines 22 (the axial direction Y of the bend of the resin substrate layer 10b). Further, the openings Sb are formed overlapping the frame wiring lines 22 in a plan view, and are formed below the frame wiring lines 22 along the extension direction of the frame wiring lines 22. Thus, peeling between the first and second resin films 23a 23b caused by the bending of the resin substrate layer 10a in the bending region B and damage to the inorganic insulating film 24b can be further minimized. Thus, breakage of the frame wiring line 22 can be further prevented.

Third Embodiment

Figure 11:
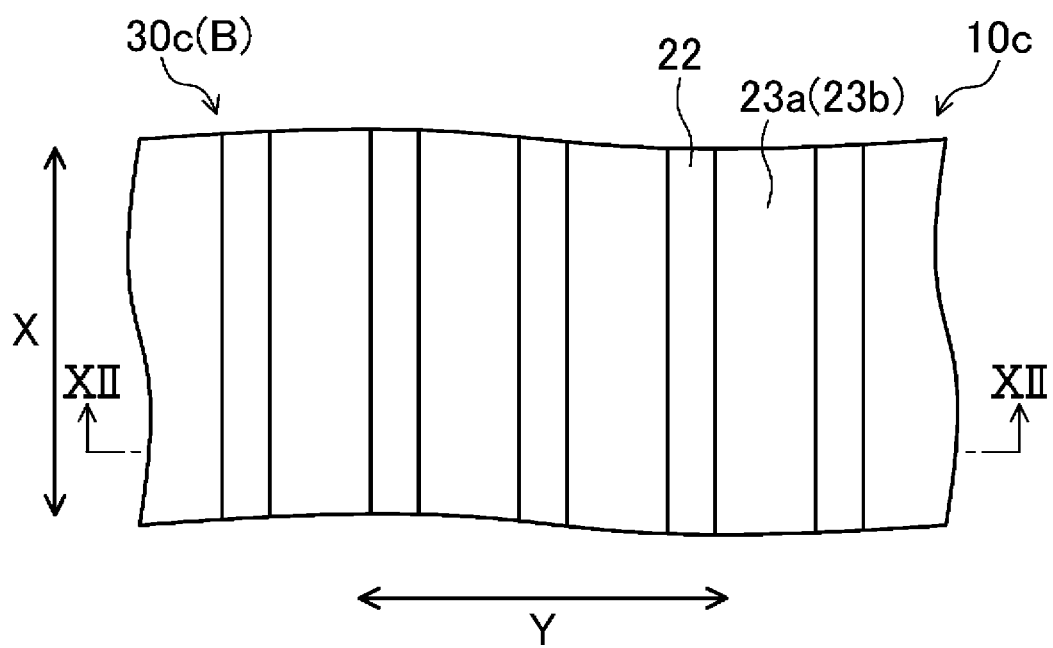
FIG. 11 is an enlarged plan view corresponding to FIG. 7 illustrating only the bending region of an organic EL display device according to a third embodiment of the disclosure.
Figure 12:
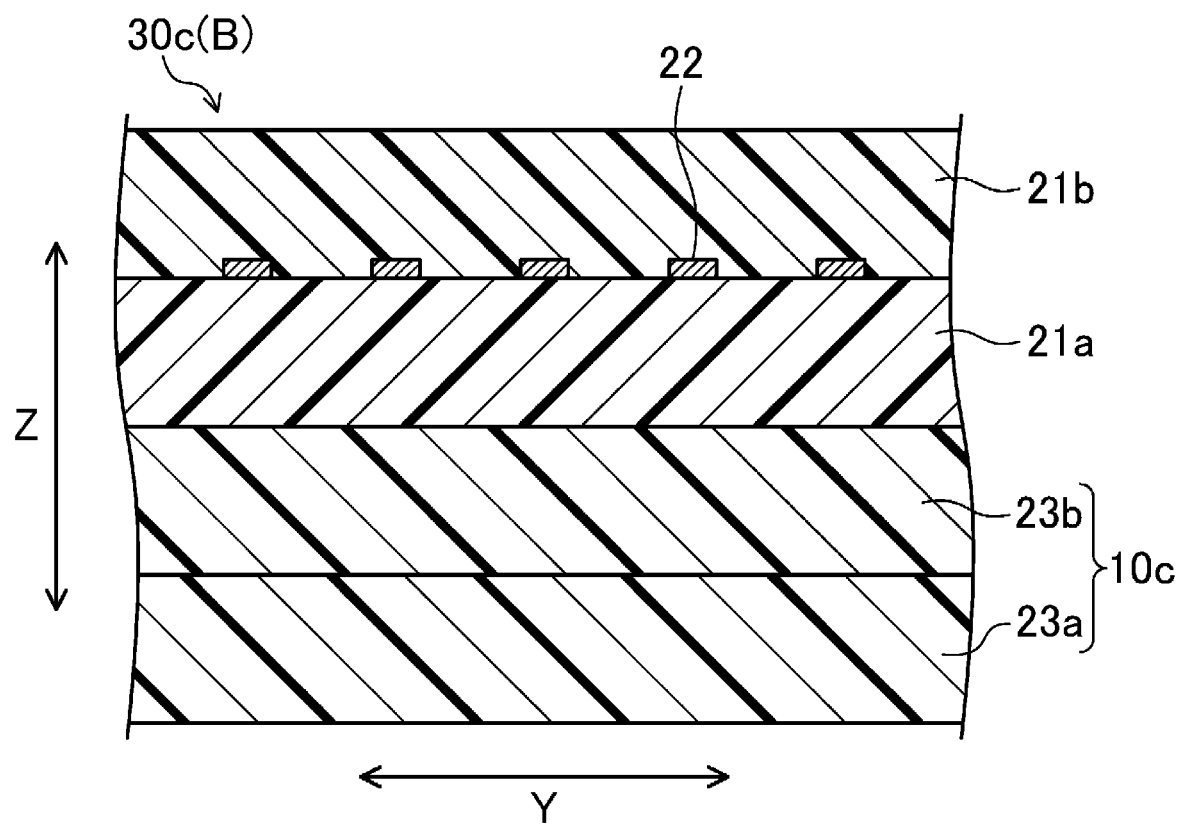
FIG. 12 is an enlarged cross-sectional view, taken along the line XII-XII of FIG. 11, illustrating only the bending region of the organic EL display device according to the third embodiment of the disclosure.

A third embodiment of the disclosure will be described below. FIG. 11 is an enlarged plan view corresponding to FIG. 7 illustrating only the bending region B of an organic EL display device 30c according to the present embodiment. FIG. 12 is an enlarged cross-sectional view, taken along the line XII-XII of FIG. 11, illustrating only the bending region B of the organic EL display device 30c. Note that, except for the bending region B, the entire configuration of the organic EL display device 30c including the display region D and the frame region F is the same as that of the first embodiment described above, and detailed description thereof will be omitted. Note that elements common to those in the first embodiment are denoted by the same reference signs, and duplicated description thereof will be omitted.

In the organic EL display device 30c of the present embodiment, as illustrated in FIG. 11 and FIG. 12, the first resin film 23a and the second resin film 23b are in contact with one another without being interposed by an inorganic insulating film 24c. Note that in the enlarged plan view of FIG. 11, the first flattening film 21a and the second flattening film 21b on a resin substrate layer 10c are omitted.

In other words, as illustrated in FIG. 11 and FIG. 12, in the bending region B, the inorganic insulating film 24c is not provided between the first resin film 23a and the second resin film 23b.

Note that the organic EL display device 30c of the present embodiment can be manufactured by forming the second resin film 23b on the first resin film 23a without providing the inorganic insulating film 24c in the manufacturing method for the organic EL display device 30a of the first embodiment described above.

The organic EL display device 30c of the present embodiment described above can achieve the following effects (7) to (9).

(7) In the bending region B, the inorganic insulating film 24c is not provided on the first resin film 23a, and the first resin film 23a and the second resin film 23b are in direct contact with one another, without being interposed by the inorganic insulating film 24c, in all regions of the bending region B. Thus, adhesion between the first resin film 23a and the second resin film 23b is further improved.

(8) Because the inorganic insulating film 24c is not provided in the bending region B, damage to the inorganic insulating film 24c can be prevented.

(9) According to (7) and (8) described above, in the bending region B, breakage of the frame wiring line 22 can be further minimized.

Other Embodiments

Figure 13:
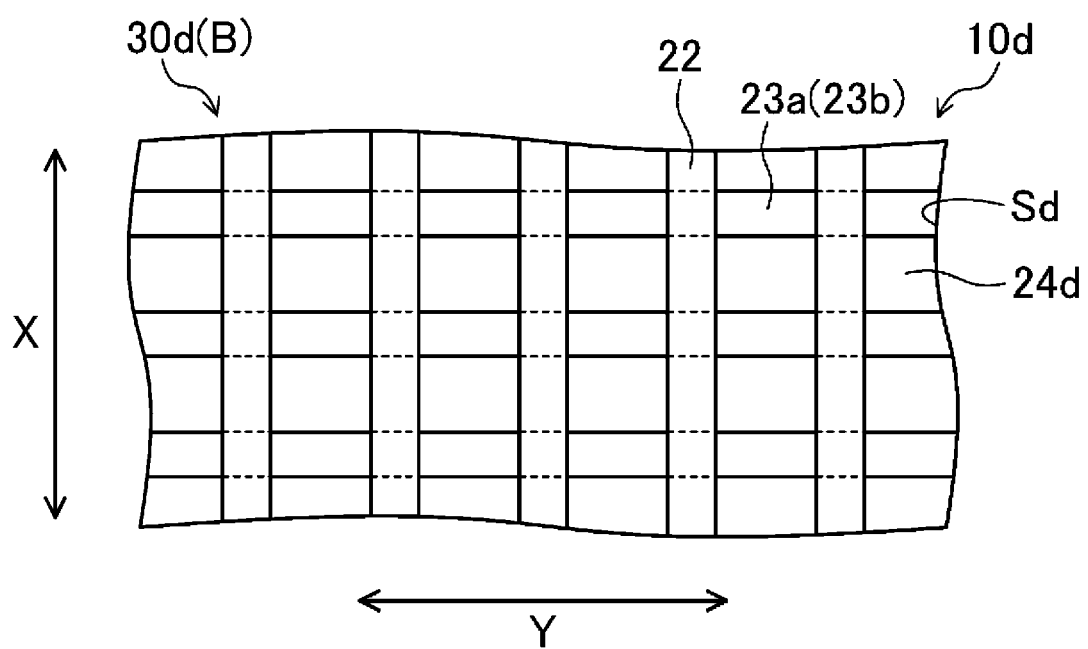
FIG. 13 is an enlarged plan view corresponding to FIG. 7 illustrating only the bending region of an organic EL display device according to a modified example of the disclosure.

As in an organic EL display device 30d illustrated in FIG. 13, an inorganic insulating film 24d in the bending region B may be provided in an island shape in a plan view. Note that in the enlarged plan view of FIG. 13, the first flattening film 21a and the second flattening film 21b on a resin substrate layer 10d are omitted. In this case, in portions where the island-shaped inorganic insulating film 24d is not provided in a plan view, that is, in openings Sd, the first resin film 23a and the second resin film 23b are in direct contact with one another.

As illustrated in FIG. 13, a plurality (four in FIG. 13) of the inorganic insulating films 24d are provided along the axial direction Y of the bend of the resin substrate layer 10d.

Note that the organic EL display device 30d can be manufactured, by using a negative photosensitive organic insulating film instead of a positive photosensitive organic insulating film in the manufacturing method for the organic EL display device 30a of the first embodiment described above.

The organic EL display device 30d of the present embodiment described above can achieve the effects (1) to (3) described above.

Figure 14:
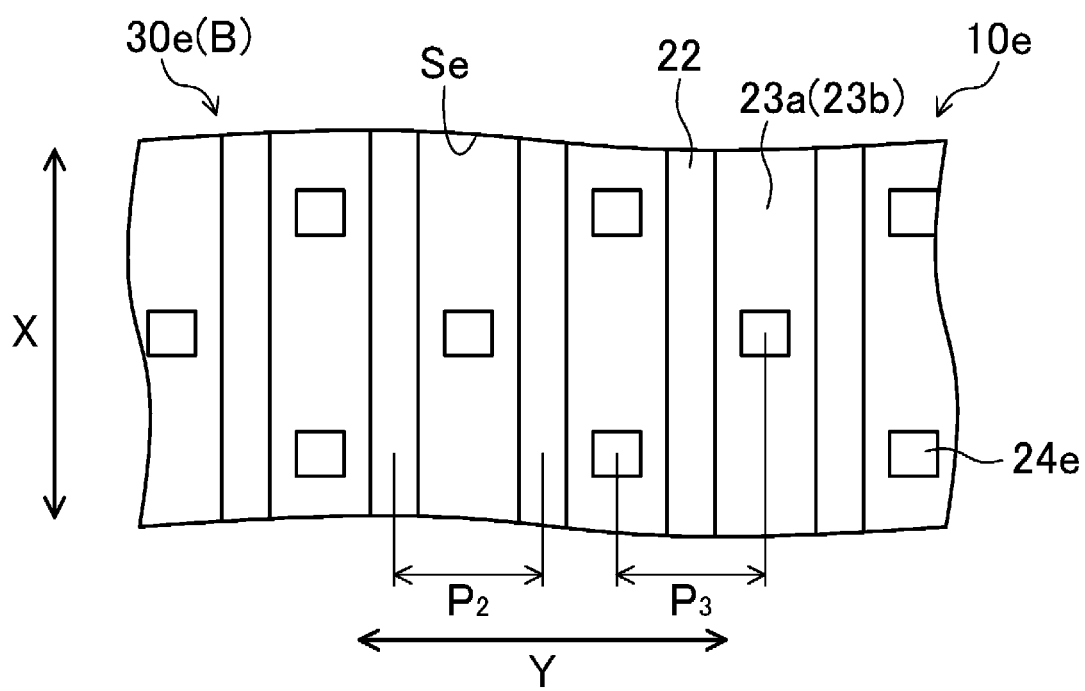
FIG. 14 is an enlarged plan view corresponding to FIG. 7 illustrating only the bending region of an organic EL display device according to a modified example of the disclosure.

Also, as in an organic EL display device 30e illustrated in FIG. 14, in a plan view, a plurality (nine in FIG. 14) of inorganic insulating films 24e may be provided in a staggered manner in the bending region B, Note that in the enlarged plan view of FIG. 14, the first flattening film 21a and the second flattening film 21b on a resin substrate layer 10e are omitted. In this configuration, in portions where the staggered inorganic insulating films 24e are not provided in a plan view, in other words, in openings Se, the first resin film 23a and the second resin film 23b are in direct contact with one another.

As illustrated in FIG. 14, the inorganic insulating films 24e are provided along the axial direction Y of the bend of the resin substrate layer 10e.

The inorganic insulating film 24e has the same characteristics as the opening Sb described above. Specifically, as illustrated in FIG. 14, the inorganic insulating films 24e are configured such that a pitch $P_3$ of adjacent inorganic insulating films 24e is substantially the same as the pitch $P_2$ of adjacent frame wiring lines 22 in the direction substantially orthogonal to the extension direction of the frame wiring lines 22, that is, in the present embodiment, in the axial direction Y of the bend of the resin substrate layer 10e. Additionally, as illustrated in FIG. 14, the inorganic insulating films 24e do not overlap the frame wiring lines 22, and the openings Se are provided below the frame wiring lines 22. As a result, peeling between the first and second resin films 23a, 23b caused by bending of the resin substrate layer 10e in the bending region B and damage to the inorganic insulating film 24e can be further minimized. Thus, breakage of the frame wiring line 22 can be further minimized.

Note that the organic EL display device 30e can be manufactured by using a negative photosensitive organic insulating film instead of a positive photosensitive organic insulating film in the method for manufacturing the organic EL display device 30b of the second embodiment described above.

The organic EL display device 30e of the present embodiment described above can achieve the effects (1) to (6) described above.

Figure 15:
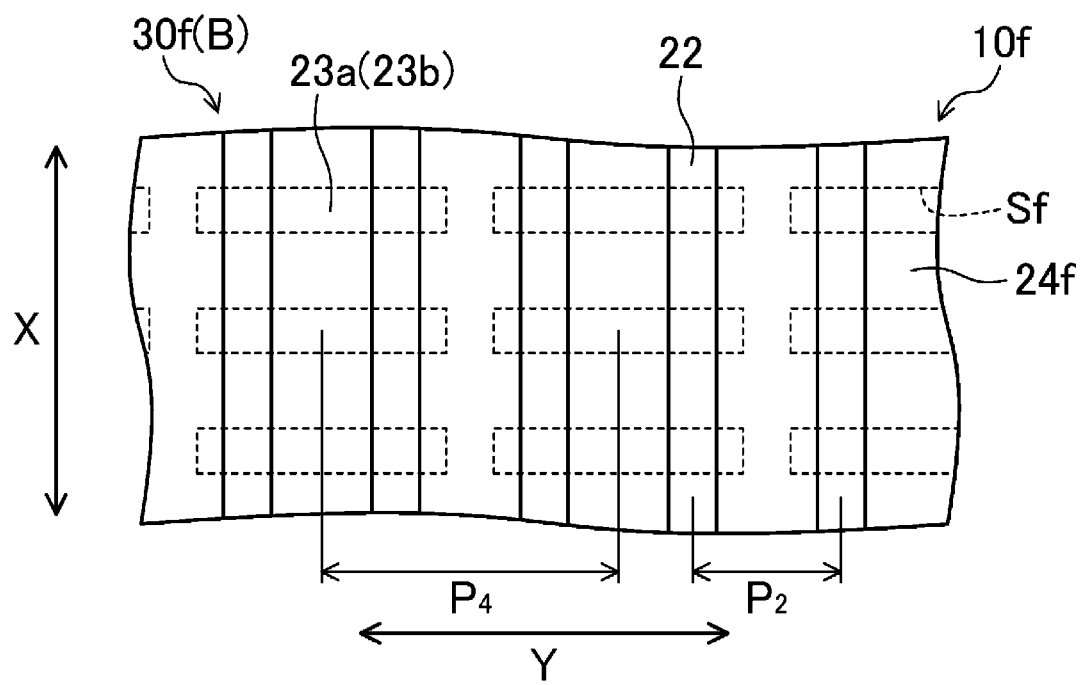
FIG. 15 is an enlarged plan view corresponding to FIG. 7 illustrating only the bending region of an organic EL display device according to a modified example of the disclosure.

Also, as in an organic EL display device 30f illustrated in FIG. 15, a pitch $P_4$ of adjacent openings Sf may differ from the pitch $P_2$ of adjacent frame wiring lines 22 in the direction substantially orthogonal to the extension direction of the frame wiring lines 22 (that is, in the axial direction Y of the bend of a resin substrate layer 10f). Note that, in the enlarged plan view of FIG. 15, the first flattening film 21a and the second flattening film 21b on the resin substrate layer 10f are omitted. In this case, the openings Sf overlap the frame wiring lines 22 in a plan view. More specifically, the openings Sf span across the frame wiring lines 22 in a plan view.

Figure 16:
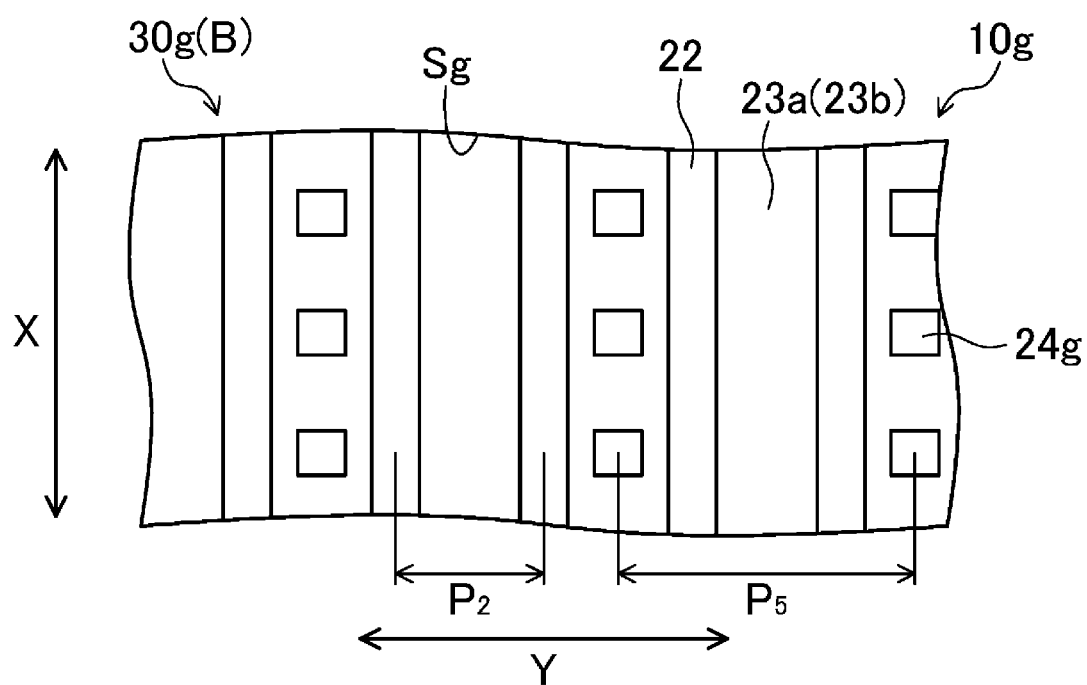
FIG. 16 is an enlarged plan view corresponding to FIG. 7 illustrating only the bending region of an organic EL display device according to a modified example of the disclosure.

Also, as in an organic EL display device 30g illustrated in FIG. 16, a pitch $P_5$ of adjacent island-shaped inorganic insulating films 24g may differ from the pitch $P_2$ of adjacent frame wiring lines 22 in the direction substantially orthogonal to the extension direction of the frame wiring lines 22 (that is, in the axial direction Y of the bend of a resin substrate layer 10g). Note that, in the enlarged plan view of FIG. 16, the first flattening film 21a and the second flattening film 21b on the resin substrate layer 10g are omitted. In this case, the island-shaped inorganic insulating films 24g do not overlap the frame wiring lines 22 in a plan view.

In the above-described embodiments, an organic EL layer having a live-layer structure including the hole injection layer, the hole transport layer, the light-emitting layer, the electron transport layer, and the electron injection layer is described. However, for example, the organic EL layer may have a three-layer structure including a hole injection-cum-transport layer, a light-emitting layer, and an electron transport-cum-injection layer.

In each of the embodiments described above, the organic EL display device including the first electrode as an anode and the second electrode as a cathode is exemplified. The disclosure is also applicable to an organic EL display device, in which the layers of the structure of the organic EL layer are in the reverse order, with the first electrode being a cathode and the second electrode being an anode.

In each of the embodiments described above, the organic EL display device including an element substrate, in which the electrode of the TFT connected to the first electrode serves as the drain electrode, is exemplified. The disclosure is also applicable to an organic EL display device including an element substrate, in which the electrode of the TFT connected to the first electrode is referred to as the source electrode.

Although the foregoing embodiments describe organic EL display devices as examples of display devices, the disclosure can be applied in display devices including a plurality of light-emitting elements that are driven by an electrical current. For example, the disclosure is applicable to display devices including quantum dot light-emitting diodes (QLEDs), which are light-emitting elements using a quantum dot-containing layer.

INDUSTRIAL APPLICABILITY

As described above, the disclosure is useful for a flexible display device.

The invention claimed is:
1. A display device, comprising:
a resin substrate including a first resin film, an inorganic insulating film, and a second resin film layered in this order;
a light-emitting element included in a display region, the light-emitting element being provided over the resin substrate with a TFT layer in between;
a frame region provided around the display region;
a terminal portion provided at an end portion of the frame region;
a bending region provided between the display region and the terminal portion;
at least one inorganic film provided in the frame region and included in the TFT layer layered on a surface of the resin substrate;
a frame flattening film provided covering the inorganic film on the surface of the resin substrate; and
frame wiring lines connected to the light-emitting element and extending to the terminal portion, the frame wiring lines being provided on a surface of the inorganic film and a surface of the frame flattening film,
wherein in the bending portion, a slit is formed in the inorganic film extending through the inorganic film and exposing an upper surface of the second resin film of the resin substrate,
at least one opening is formed in the inorganic insulating film of the resin substrate in the bending region, and
the first resin film and the second resin film are in contact with one another in the opening.

2. The display device according to claim 1, wherein the opening is formed along an axial direction of a bend of the resin substrate.

3. The display device according to claim 2, wherein the opening is formed along an axial direction of a bend of the resin substrate extending to both ends.

4. The display device according to claim 1, wherein the opening is provided as a plurality of openings.

5. The display device according to claim 4, wherein the plurality of openings are formed along an axial direction of a bend of the resin substrate.

6. The display device according to claim 4, wherein the plurality of openings are provided in a staggered manner in a plan view.

7. The display device according to claim 4, wherein a pitch of adjacent openings is substantially equal to a pitch of adjacent frame wiring lines in a direction substantially orthogonal to an extension direction of the frame wiring lines.

8. The display device according to claim 4, wherein the plurality of openings overlap the frame wiring lines in a plan view.

9. The display device according to claim 4, wherein the plurality of openings are provided spanning across the frame wiring lines in a plan view.

10. The display device according to claim 1, wherein, in the bending region, the second resin film and the frame flattening film come into contact with one another.

11. The display device according to claim 1, wherein the light-emitting element is an organic EL element.

12. A display device, comprising:
a resin substrate including a first resin film, an inorganic insulating film, and a second resin film layered in this order;
a light-emitting element included in a display region, the light-emitting element being provided over the resin substrate with a TFT layer in between;
a frame region provided around the display region;
a terminal portion provided at an end portion of the frame region;
a bending region provided between the display region and the terminal portion;
at least one inorganic film provided in the frame region and included in the TFT layer layered on a surface of the resin substrate;
a frame flattening film provided covering the inorganic film on the surface of the resin substrate; and
frame wiring lines connected to the light-emitting element and extending to the terminal portion, the frame wiring lines being provided on a surface of the inorganic film and a surface of the frame flattening film, wherein, in the bending portion, a slit is formed in the inorganic film extending through the inorganic film and exposing an upper surface of the second resin film of the resin substrate,
the inorganic insulating film is provided in an island shape in a plan view in the resin substrate in the bending region, and
the first resin film and the second resin film are in contact with one another in a portion where the inorganic insulating film is not provided in a plan view.

13. The display device according to claim 12, wherein the inorganic insulating film is provided as a plurality of inorganic insulating films.

14. The display device according to claim 13, wherein the plurality of inorganic insulating films are formed along an axial direction of a bend of the resin substrate.

15. The display device according to claim 13, wherein the plurality of inorganic insulating films are provided in a staggered manner in a plan view.

16. The display device according to claim 13, wherein a pitch of adjacent inorganic insulating films of the plurality of inorganic insulating films is substantially equal to a pitch of adjacent frame wiring lines in a direction substantially orthogonal to an extension direction of the frame wiring lines.

17. The display device according to claim 13, wherein the plurality of inorganic insulating films do not overlap the frame wiring lines in a plan view.

18. A display device, comprising:
a resin substrate including a first resin film, an inorganic insulating film, and a second resin film layered in this order;
a light-emitting element included in a display region, the light-emitting element being provided over the resin substrate with a TFT layer in between;
a frame region provided around the display region;
a terminal portion provided at an end portion of the frame region;
a bending region provided between the display region and the terminal portion;
at least one inorganic film provided in the frame region and included in the TFT layer layered on a surface of the resin substrate;
a frame flattening film provided covering the inorganic film on the surface of the resin substrate; and
frame wiring lines connected to the light-emitting element and extending to the terminal portion, the frame wiring lines being provided on a surface of the inorganic film and a surface of the frame flattening film,
wherein, in the bending portion, a slit is formed in the inorganic film extending through the inorganic film and exposing an upper surface of the second resin film of the resin substrate, and
the first resin film and the second resin film are in contact with one another without the inorganic insulating film interebetween in the resin substrate in the bending region.

* * * * *